(12) United States Patent
Su

(10) Patent No.: US 11,075,306 B2
(45) Date of Patent: Jul. 27, 2021

(54) FILLED THROUGH SILICON VIAS FOR SEMICONDUCTOR PACKAGES AND RELATED METHODS

(71) Applicant: SEMICONDUCTOR COMPONENTS INDUSTRIES, LLC, Phoenix, AZ (US)

(72) Inventor: Bingzhi Su, Boise, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 442 days.

(21) Appl. No.: 15/783,239

(22) Filed: Oct. 13, 2017

(65) Prior Publication Data
US 2019/0115482 A1   Apr. 18, 2019

(51) Int. Cl.
*H01L 31/0203* (2014.01)
*H01L 27/146* (2006.01)
*H01L 21/768* (2006.01)

(52) U.S. Cl.
CPC .... *H01L 31/0203* (2013.01); *H01L 21/76877* (2013.01); *H01L 27/14636* (2013.01)

(58) Field of Classification Search
CPC .......... H01L 31/0203; H01L 21/76877; H01L 27/14636; H01L 21/76898
See application file for complete search history.

(56) References Cited

U.S. PATENT DOCUMENTS

| 5,251,806 | A * | 10/1993 | Agarwala | H01L 24/11 228/180.22 |
| 5,269,453 | A * | 12/1993 | Melton | H01L 23/49866 228/180.22 |
| 9,754,983 | B1 * | 9/2017 | Su | H01L 27/14618 |
| 2008/0284041 | A1 * | 11/2008 | Jang | H01L 21/76898 257/774 |
| 2008/0303163 | A1 * | 12/2008 | Liu | H01L 21/76898 257/772 |

OTHER PUBLICATIONS

Maxim Integrated Products, Inc., "Application Note 1891, Wafer-Level Packaging (WLP) and its Applications," (Jul. 22, 2015), available at https://www.maximintegrated.com/en/app-notes/index.mvp/id/1891, last visited Sep. 20, 2017.
Fan et al., "Mechanism Analysis for Moisture-Induced Failure in IC Packages," ASME International Mechanical Engineering Congress & Exposition, 11th Symposium on Mechanics of Surface Mount Assemblies, IMECE/EPE-14, (Nov. 1999).
Microsemi Corporation, "Moisture Sensitivity," (2011).

* cited by examiner

Primary Examiner — Laura M Menz
Assistant Examiner — Candice Chan
(74) Attorney, Agent, or Firm — Adam R. Stephenson, Ltd.

(57) ABSTRACT

Implementations of semiconductor packages may include: a wafer having a first side and a second side, a solder pad coupled to the first side of the wafer, a through silicon via (TSV) extending from the second side of the wafer to the solder pad a metal layer around the walls of the TSV, and a low melting temperature solder in the TSV. The low melting temperature solder may also be coupled to the metal layer. The low melting temperature solder may couple to the solder pad through an opening in a base layer metal of the solder pad.

13 Claims, 2 Drawing Sheets

FILLED THROUGH SILICON VIAS FOR SEMICONDUCTOR PACKAGES AND RELATED METHODS

BACKGROUND

1. Technical Field

Aspects of this document relate generally to semiconductor packages, such as chip scale packages (CSP) for image sensors. More specific implementations involve modifications to semiconductor packages using Micro Via Pad (MVP) technology.

2. Background

Conventionally, wafer level packaging technology uses solder mask or similar material as the cavity wall. The package usually works well in the reflow process when the package size is small. To prevent the package from cracking during reflow, pre-baking is usually required. Thicker silicon is also used in wafer level packaging to prevent popcorn cracking of the package during testing caused by expansion of water vapor in the cavity of the package.

SUMMARY

Implementations of semiconductor packages may include: a wafer having a first side and a second side, a solder pad coupled to the first side of the wafer, a through silicon via (TSV) extending from the second side of the wafer to the solder pad, a metal layer around the walls of the TSV, and a low melting temperature solder in the TSV. The low melting temperature solder may also be coupled to the metal layer. The low melting temperature solder may couple to the solder pad through an opening in a base layer metal of the solder pad.

Implementations of semiconductor packages may include one, all, or any of the following:

The low melting temperature solder and the solder pad may be configured to allow contaminants and water vapor to pass through an opening in the solder pad and the low melting temperature solder created when the wafer is heated above a melting temperature of the low melting temperature solder.

The low melting temperature solder may melt before 105° C.

The wafer may not be heated above 260° C.

The glass lid may be coupled over the wafer.

The semiconductor package may be an image sensor chip scale package (CSP).

The semiconductor package may further include a ball grid array coupled to the second side of the wafer.

Implementations of a method of forming semiconductor packages may include: providing a wafer including a first side and a second side, coupling one or more solder pads to the first side of the wafer; sealing the one or more solder pads in a cavity through coupling a glass lid to the first side of the wafer; etching a through silicon via (TSV) through the wafer starting at the second side of the wafer and stopping at a second side of the one or more solder pads; depositing a metal layer onto a wall of the TSV and the second side of the one or more solder pads; drilling a hole through the metal layer and into the solder pad; and depositing solder within the TSV.

Implementations of a method of forming semiconductor packages may include one, all, or any of the following:

The solder and the solder pad may be configured to allow contaminants and water vapor to pass through an opening in the solder pad and the solder when the wafer is heated above a melting temperature of the solder.

The solder may be a low temperature solder.

A melting temperature of the low temperature solder may be 105° C.

The method may further include coupling a glass lid to the first side of the wafer.

The method may further include coupling a ball grid array to the second side of the wafer.

The semiconductor package may be an image sensor chip scale package (CSP).

Implementations of a method of eliminating water contamination from a semiconductor packages may include: providing a device including: a wafer, a through silicon via (TSV) covered by a solder pad, the TSV including a metal layer on a wall, and a low melting temperature solder in the TSV. The low melting temperature solder may be coupled to the solder pad through an opening in a base layer metal of the solder pad. The method may further include heating the device above a melting temperature of the solder, allowing contamination to flow through a pass way in the solder, and cooling the solder to close the pass way.

Implementations of a method of eliminating water contamination from a semiconductor packages may include one, all, or any of the following:

The device may be an image sensor chip scale package (CSP).

The device may further include a glass lid coupled to the wafer.

The device may further include a ball grid array.

A melting temperature of the low melting temperature solder is 105° C.

The heating of the device may not exceed 260° C.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
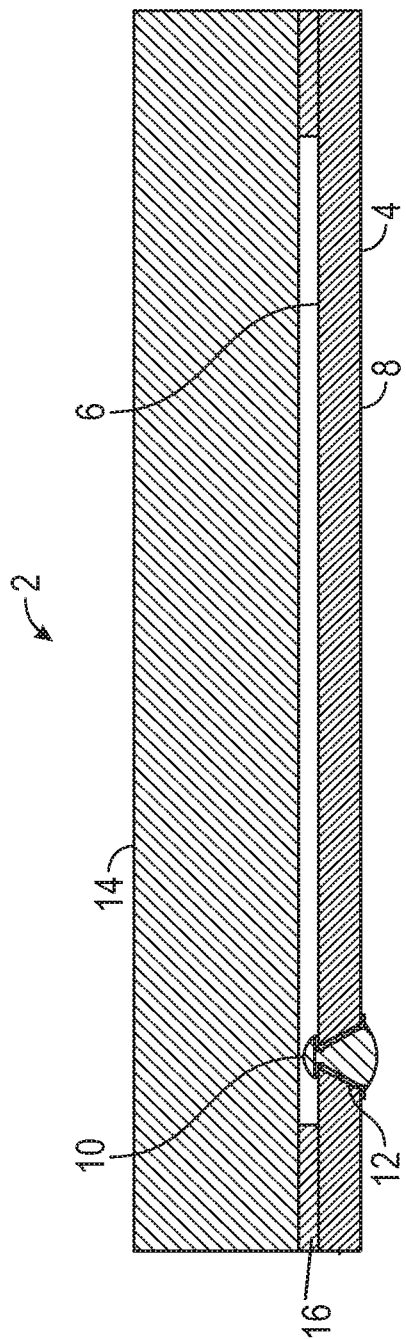
FIG. 1 is a side view of an implementation of a semiconductor package having a through silicon via (TSV) as described herein.

Referring to FIG. 1, an implementation of a semiconductor package 2 is illustrated. The semiconductor package 2 may be an image sensor chip scale package (CSP). However, the principles disclosed herein may be used with any package type that contains an open cavity therein, such as by non-limiting example, a complementary metal oxide semiconductor (CMOS) image sensor (CIS), stacked die package, or other similar semiconductor packages. The package 2 includes a wafer 4 having a first side 6 and a second side 8. In various implementations, the wafer may be made of silicon. In other implementations, the wafer may be made of another suitable material such as, by non-limiting example, germanium, silicon germanium, graded silicon germanium, silicon on insulator, glass, sapphire, ruby, gallium arsenide and any other semiconductor substrate. A solder pad 10 is coupled to the first side 6 of the wafer 8. By non-limiting example, the solder pad 10 may include low-temperature solder reflowed onto a pre-designed solder pad. A through silicon via (TSV) 12 extends from the second side 8 of the wafer to the bottom of the solder pad 10.

In various implementations, this package may also be formed using individual die. The die may be formed of glass, ceramic, or other similar materials. The individual die may be coupled to a semiconductor substrate such as silicon, germanium, silicon germanium, graded silicon germanium, silicon on insulator, glass, sapphire, ruby, gallium arsenide and any other semiconductor substrate. The die may also be coupled to a resin based substrate such as, by non-limiting example, Bismaleimide-Triazine (BT).

Figure 2:
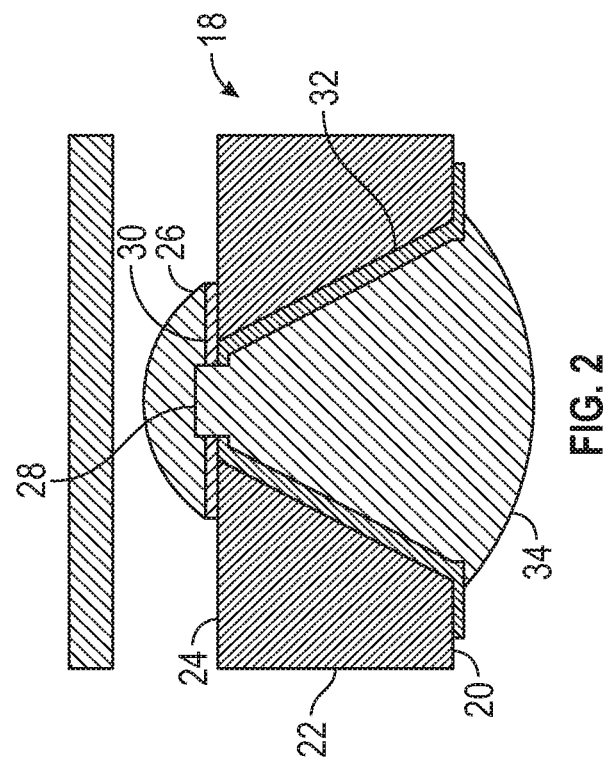
FIG. 2 is an exploded view of an implementation of a TSV as described herein.

As illustrated, the package 2 also includes a glass lid 14 coupled to the wafer 4 through cavity walls 16. The lid 14 may also be formed of various optically translucent and/or transparent material allowing light from outside the package to reach the wafer. The cavity walls 16 may be made of, by non-limiting example, an epoxy-based polymer, a polyimide polymer, a phenol polymer, an acrylic polymer, a novolak polymer, a benzocyclobutenes (BCB) polymer, a polybenzoxazoles (PBO) polymer, a polynorbornene polymer, or any other polymeric material. In various implementations, the package may include a ball grid array coupled to the second side of the wafer. Referring to FIG. 2, an exploded view of an implementation of a TSV 18 as described herein is illustrated. In this view, the TSV 18 is illustrated extending from a second side 20 of a wafer 22 to the first side 24 of the wafer 22 where a solder pad 26 is coupled to the wafer 22. The TSV 18 extends partly into the material solder pad 26 as can be seen by the etch 28 through a base layer metal 30 of the solder pad 26. In other implementations, however, the TSV 18 may not extend into the solder pad, particularly where the etch chemistry is selective to the material of the wafer and not to the metal.

As illustrated, a metal layer 32 is present around the walls of the TSV 18. This metal layer 32 may be a seed layer for use in depositing the solder into the TSV 18. In other implementations, the metal layer 32 may include a diffusion barrier layer to prevent migration of the metals in the TSV into the substrate. A low melting temperature solder 34 in the TSV 18 is coupled to the metal layer 32. The low melting temperature solder 34 may be plated into the TSV 18 or may be deposited by directly dispensing the liquid solder into the opening. In various implementations, the low melting temperature solder 34 may melt before 105° C. and is employed when the package is heated to a temperature not above 260° C. In various implementations, there would be no visible differentiation between the solder in the TSV and the solder in the solder pad as the solder would melt together and blend when heated.

In various implementations, a package may include more than one TSV as described herein located in various locations around the cavity of the package.

Referring to FIG. 3A-3F, an implementation of a method of forming a semiconductor package including a through silicon via (TSV) as described herein is illustrated. FIGS. 3A-3F provide a close-up view of the package which focuses on the formation of the TSV, however, it will be understood that the remaining package is formed. In various implementations, the method may be carried out before the glass cover is attached to the wafer; in others, the method may be carried out after the cover is coupled over the wafer.

Figure 3A:
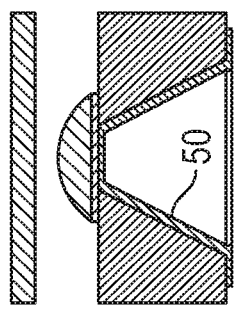
FIG. 3A-3F is a side of view of an implementation of a method of forming a semiconductor package as described herein.
Figure 3B:
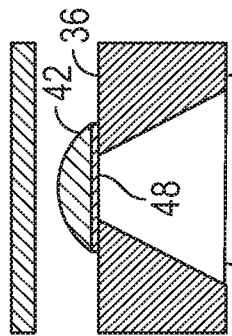

Referring to FIG. 3A, the method includes providing a wafer 36 having a first side 38 and a second side 40 and coupling one or more solder pads 42 to the first side of the wafer. The solder pad 42 may include solder coupled with a metal layer. In various implementations, the wafer 36 may be formed from silicon or any other material disclosed herein. Referring to FIG. 3B, a glass lid 44 is coupled to the first side 38 of the wafer 36 sealing the one or more solder pads 42 in a cavity. Though not visible in FIG. 3B, the glass lid may be coupled to the wafer through two or more cavity walls as illustrated in FIG. 1. As previously described, other transparent materials may be used for the lid other than glass.

Figure 3C:
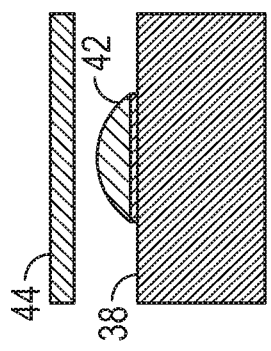

Referring to FIG. 3C, a through silicon via (TSV) 46 is etched through the wafer 36 starting at the second side 40 of the wafer 36 and stopping at a second side 48 of the one or more solder pads 42. The etching may be performed using a Bosch deep reactive ion etching (DRIE) method where the wafer is made of silicon or another wet or dry etching technique compatible with the material of the wafer.

Figure 3E:
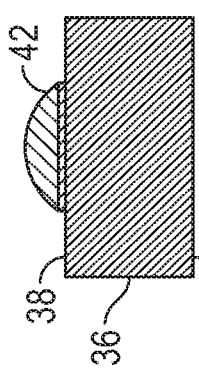
Figure 3F:
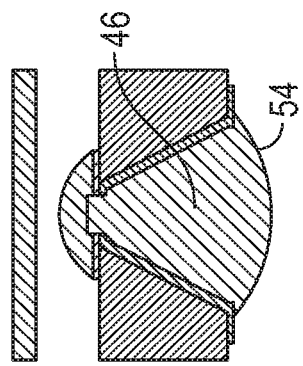
Figure 3D:
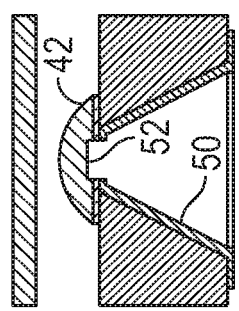

Referring to FIG. 3D, a metal layer 50 is deposited onto a wall of the TSV 46 and on the second side 48 of the one or more solder pads 42. Referring to FIG. 3E, a hole 52 is drilled through the metal layer 50 and into the solder pad 42. The solder of the solder pad 42 may be used to protect the package from contamination during the drilling process and during other parts of the method. In various implementations, the package may include an image sensor die including a pixel array. Referring to FIG. 3F, a low melting temperature solder 54 is deposited within the TSV 46 using any technique disclosed herein. The low melting temperature solder and the solder pad are configured to allow contaminants and water vapor to pass through an opening in the solder pad at the low melting temperature when the wafer is heated above a melting temperature of the solder. In various implementations, after the solder has been heated in the TSV and on the solder pad the substances would meld together and leave visible differentiation between the layers.

Figure 4A:
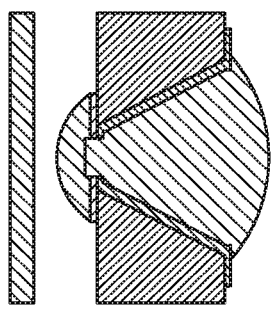
FIG. 4A-4D is a side view of an implementation of a method of eliminating water and other contamination from a semiconductor package.
Figure 4B:
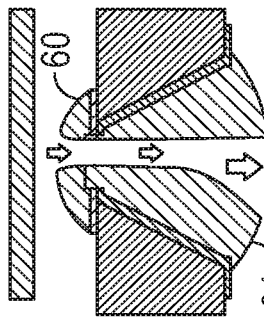

Referring to FIGS. 4A-4D, an implementation of a method of eliminating water contamination from a semiconductor package is illustrated. As described in FIGS. 3A-3F, FIGS. 4A-4D provide a close-up view of the package which focuses on the TSV including movement of the solder and contaminants. Referring to FIG. 4A-4B, a device 56 is provided having a wafer, a through silicon via (TSV) 58 covered by a solder pad 60, and a low melting temperature solder 64 in the TSV 58. The TSV 58 includes a metal layer 62 on a wall of the TSV 58.

Figure 4C:
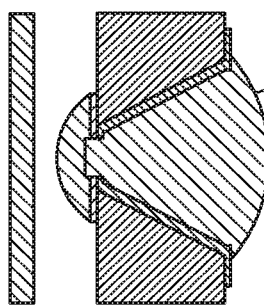
Figure 4D:
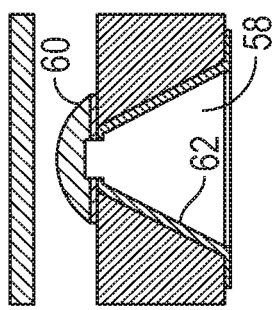

As illustrated in FIG. 4C, the method includes heating the device above a melting temperature of the low temperature solder 60 and 64. In the reflow process, the low melting temperature solder melts before the semiconductor package reaches a peak temperature it is designed to withstand. The melting temperature of the solder may be 105° C. or lower. As the solder 60 and 64 is heated a pass way/channel 66 forms in the solder and contaminants in the cavity of the package are allowed to flow out of the package/device through the pass way 66. The contaminants may be water, organic compounds, or other gaseous or volatilizable components in the cavity. While a single continuous pass way is illustrated in FIG. 4C, it may be understood that the pass way may open and reclose one or more times as the contaminants volatilize over the period of time the cavity is heated and which creates periodic pressure build up against the low temperature solder. In the subsequent portions of the package reflow process, popcorn cracking due to moisture in the cavity may be prevented happen because any water/volatile contaminants has been released from the package. After the contaminants have flowed out of the package, the solder is cooled to close the pass way 66 as shown in FIG. 4D. Once the solder is cooled, a tight seal is again formed within the TSV which prevents the ingress of any further contaminants. This method may work both on hermetic packages and close to hermetic packages. In close to hermetic packages there may be more movement since moisture may be able to enter the package through a semi-hermetic seal.

This method may be useful in preventing popcorn cracking in high performance devices requiring high moisture sensitivity for automotive applications. Moisture sensitivity level (MSL) relates to the packaging and handling precautions for some semiconductor devices. The MSL is an electronic standard for the time period in which a moisture sensitive device can be exposed to ambient room conditions. Semiconductor packages for automotive application usually require at least a MSL3 rating. A device passing moisture sensitivity level 3 can be exposed to a high ambient moisture environment for 168 hours during the process of adding the device as a component to a larger project.

In other implementations, the through silicon via (TSV) may also be used in packages without a cavity where the TSV would act as a release valve. For example, in a mold array package (MAP), air and moisture may be released from the molding compound as the package is heated during the molding process. A TSV like one disclosed herein may be included in the substrate or die to allow the air and moisture to release during the molding process. A TSV as described herein may also be used in a pressure molding package involving heat, allowing air and moisture to leave the package during the pressure molding process.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a wafer comprising a first side and a second side;
   a solder pad coupled to the first side of the wafer, the solder pad comprising a layer of low melting temperature solder thereon;
   a through silicon via (TSV) extending from the second side of the wafer to the solder pad;
   a metal layer around the walls of the TSV; and
   a low melting temperature solder in the TSV and coupled to the metal layer;
   wherein the low melting temperature solder couples to the layer of low melting temperature solder on the solder pad through an opening in a base layer metal of the solder pad.

2. The semiconductor package of claim 1, wherein the low melting temperature solder and the solder pad are configured to allow contaminants and water vapor to pass through an opening in the solder pad and the low melting temperature solder created when the wafer is heated above a melting temperature of the low melting temperature solder.

3. The semiconductor package of claim 2, wherein the low melting temperature solder melts before 105° C.

4. The semiconductor package of claim 2, wherein the wafer is not heated above 260° C.

5. The semiconductor package of claim 1, wherein a glass lid is coupled over the wafer.

6. The semiconductor package of claim 1, wherein the semiconductor package is an image sensor chip scale package (CSP).

7. The semiconductor package of claim 1, further comprising a ball grid array coupled to the second side of the wafer.

8. A semiconductor package comprising:
   a wafer comprising a first side and a second side;
   a solder pad coupled to the first side of the wafer;
   a through silicon via (TSV) extending from the second side of the wafer to the solder pad;
   a metal layer around the walls of the TSV; and
   a solder with a melting point lower than 105° C. comprised in the TSV and coupled to the metal layer;
   wherein the low melting temperature solder couples to the solder pad through an opening in a base layer metal of the solder pad.

9. The semiconductor package of claim 8, wherein the low melting temperature solder and the solder pad are configured to allow contaminants and water vapor to pass through an opening in the solder pad and the low melting temperature solder created when the wafer is heated above a melting temperature of the low melting temperature solder.

10. The semiconductor package of claim 8, wherein the wafer is not heated above 260° C.

11. The semiconductor package of claim 8, wherein a glass lid is coupled over the wafer.

12. The semiconductor package of claim 8, wherein the semiconductor package is an image sensor chip scale package (CSP).

13. The semiconductor package of claim 8, further comprising a ball grid array coupled to the second side of the wafer.

* * * * *